(12) United States Patent
Kawaguchi et al.

(10) Patent No.: US 11,536,771 B2
(45) Date of Patent: Dec. 27, 2022

(54) CURRENT SENSOR

(71) Applicant: Yazaki Corporation, Tokyo (JP)

(72) Inventors: Yasunori Kawaguchi, Shizuoka (JP); Takanori Toma, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/348,995

(22) Filed: Jun. 16, 2021

(65) Prior Publication Data
US 2021/0396811 A1    Dec. 23, 2021

(30) Foreign Application Priority Data

Jun. 22, 2020  (JP) .............................. JP2020-106656

(51) Int. Cl.
*G01R 31/364*       (2019.01)
*G01R 1/20*         (2006.01)
*G01R 31/3842*      (2019.01)
*G01R 19/165*       (2006.01)
*H01M 50/567*       (2021.01)

(52) U.S. Cl.
CPC .......... *G01R 31/364* (2019.01); *G01R 1/203* (2013.01); *G01R 31/3842* (2019.01); *G01R 19/16542* (2013.01); *H01M 50/567* (2021.01)

(58) Field of Classification Search
None
See application file for complete search history.

(56) References Cited

U.S. PATENT DOCUMENTS

2015/0355244 A1*  12/2015  Sato .................... G01R 31/364
                                                        324/105
2017/0199084 A1    7/2017  Kimura

FOREIGN PATENT DOCUMENTS

| JP | 2003-47111 A    | 2/2003 |
| JP | 2009-204531 A   | 9/2009 |
| JP | 2019-161225 A   | 9/2019 |
| WO | 2016/042732 A1  | 3/2016 |

* cited by examiner

*Primary Examiner* — Jas A Sanghera
(74) *Attorney, Agent, or Firm* — Sughrue Mion, PLLC (57) ABSTRACT

The current sensor includes a battery terminal part that has electrical conductivity and is fastened to a battery post constituting a negative electrode of a battery, and a shunt resistor that is conductively connected to the battery terminal part via a joint part, the shunt resistor including a first detection terminal and a second detection terminal for detecting an electric current. The battery terminal part includes a third detection terminal for detecting a voltage of the battery between the joint part and the battery post. As a result, the current sensor can properly detect a voltage of the battery together with an electric current.

6 Claims, 8 Drawing Sheets

CURRENT SENSOR

CROSS-REFERENCE TO RELATED APPLICATION(S)

The present application claims priority to and incorporates by reference the entire contents of Japanese Patent Application No. 2020-106656 filed in Japan on Jun. 22, 2020.

BACKGROUND OF THE INVENTION

1. Field of the Invention

The present invention relates to a current sensor.

2. Description of the Related Art

As a technique related to a current sensor in the related art, for example, Japanese Patent Application Laid-open No. 2009-204531 discloses a power supply device for a vehicle including a battery, a shunt resistor, and a current detection circuit. The battery supplies electric power to a motor for causing the vehicle to travel. The shunt resistor is connected to the battery in series. The current detection circuit detects a voltage generated at both ends of the shunt resistor, and detects an electric current of the battery.

There is room for improvement in the power supply device for a vehicle disclosed in Japanese Patent Application Laid-open No. 2009-204531 described above in view of detection of a voltage of the battery, for example.

SUMMARY OF THE INVENTION

The present invention has been made in view of such a situation, and provides a current sensor that can properly detect a voltage of a battery together with an electric current.

In order to achieve the above mentioned object, a current sensor according to one aspect of the present invention includes a battery terminal part, having electrical conductivity, fastened to a battery post constituting a negative electrode of a battery; and a shunt resistor conductively connected to the battery terminal part via a joint part, the shunt resistor including a first detection terminal and a second detection terminal for detecting an electric current, wherein the battery terminal part includes a third detection terminal for detecting a voltage of the battery between the joint part and the battery post.

According to another aspect of the present invention, in the current sensor, it is possible to further include a current detection part configured to measure an electric current flowing in the shunt resistor in accordance with an output from the first detection terminal and an output from the second detection terminal; and a voltage detection part configured to measure a voltage of the battery in accordance with an output from the third detection terminal and an output from a positive electrode side of the battery.

According to still another aspect of the present invention, in the current sensor, it is possible to further include a fault determination part configured to determine a fault based on a current value that is measured in accordance with an output from the first detection terminal and an output from the second detection terminal, and a current value obtained by subtracting a current value that is measured in accordance with the output from the first detection terminal and an output from the third detection terminal from a current value that is measured in accordance with the output from the second detection terminal and the output from the third detection terminal.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following describes an embodiment according to the present invention in detail based on the drawings. The present invention is not limited to the embodiment.

Constituent elements in the following embodiment include a constituent element that can be replaced and easily conceived by those skilled in the art, or substantially the same constituent element.

In the following description, among a first direction, a second direction, and a third direction intersecting with each other, the first direction is referred to as an "axial direction X", the second direction is referred to as a "first width direction Y", and the third direction is referred to as a "second width direction Z". Herein, the axial direction X, the first width direction Y, and the second width direction Z are substantially orthogonal to each other. The axial direction X typically corresponds to a direction along a center axis C (refer to FIG. 2, for example) of a battery post on which a current sensor is disposed, a normal direction along a height direction of a battery, and the like. The first width direction Y typically corresponds to a direction in which a battery terminal part and a current sensor part are arranged side by side, a short side direction of the battery, and the like. The second width direction Z typically corresponds to a fastening direction of the battery terminal part, a long side direction of the battery, and the like. Typically, in a state in which the current sensor is installed in the vehicle and the vehicle is positioned on a horizontal plane, the axial direction X runs along a vertical direction, and the first width direction Y and the second width direction Z run along a horizontal direction. Each of the directions used in the following description represents a direction in a state in which parts are assembled to each other unless specifically noted otherwise.

Embodiment

Figure 1:
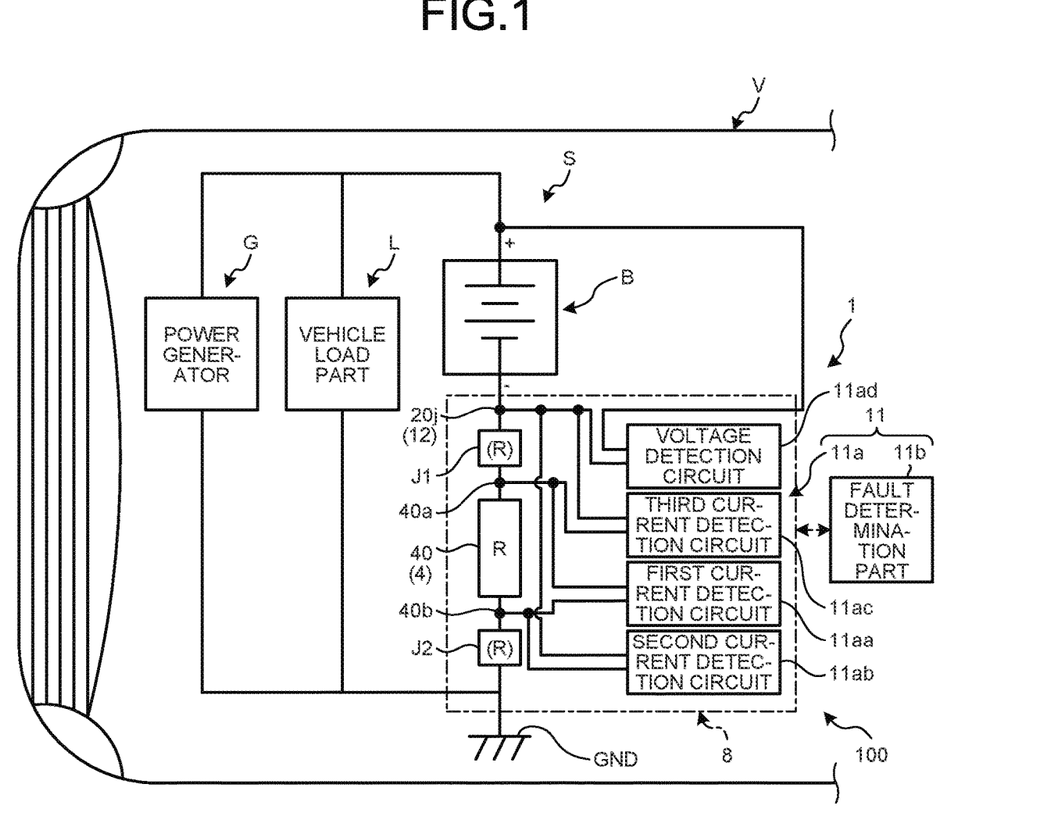
FIG. 1 is a circuit diagram representing a schematic configuration of a current sensor according to an embodiment.
Figure 2:
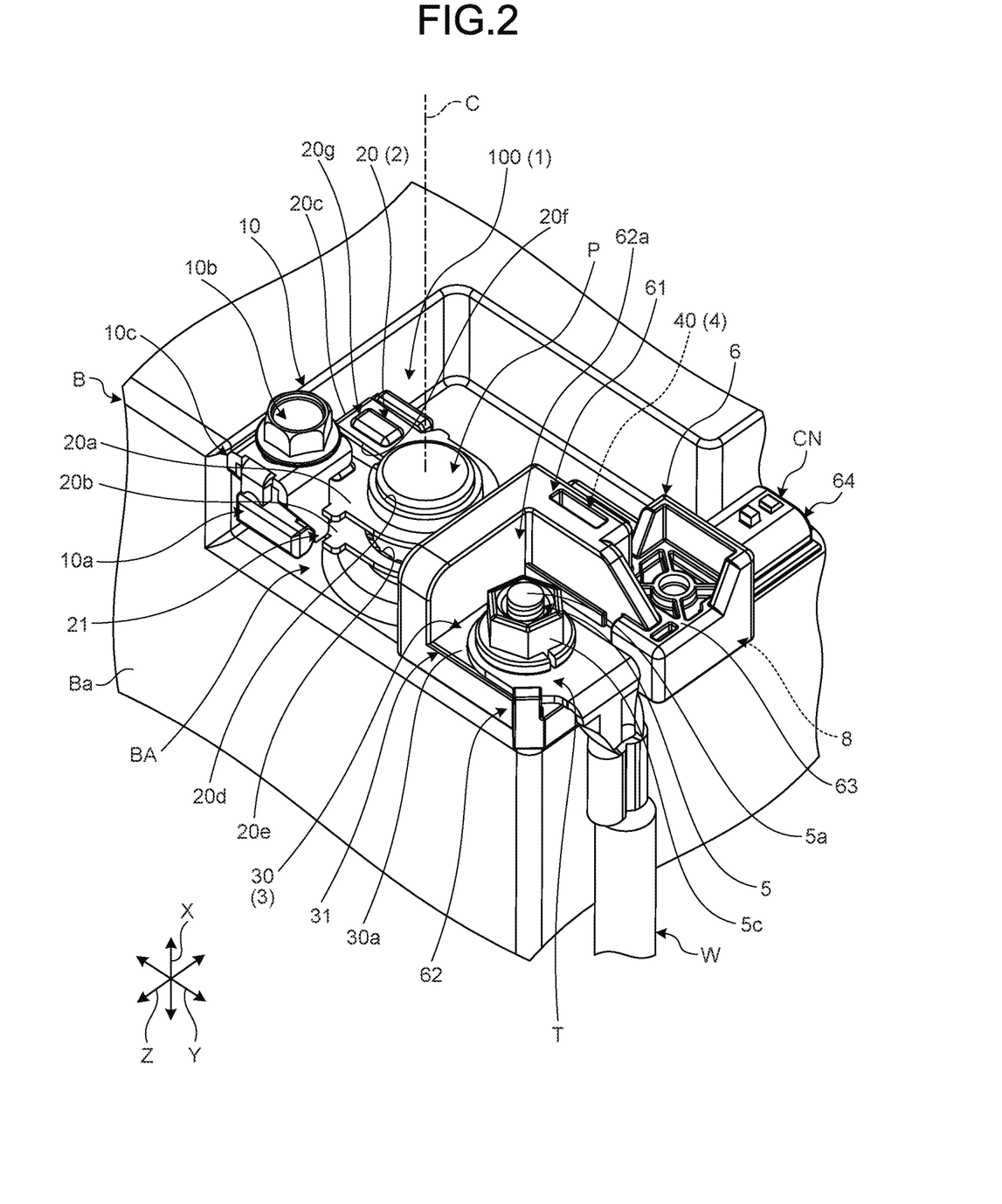
FIG. 2 is a perspective view representing a schematic configuration of the current sensor according to the embodiment.
Figure 3:
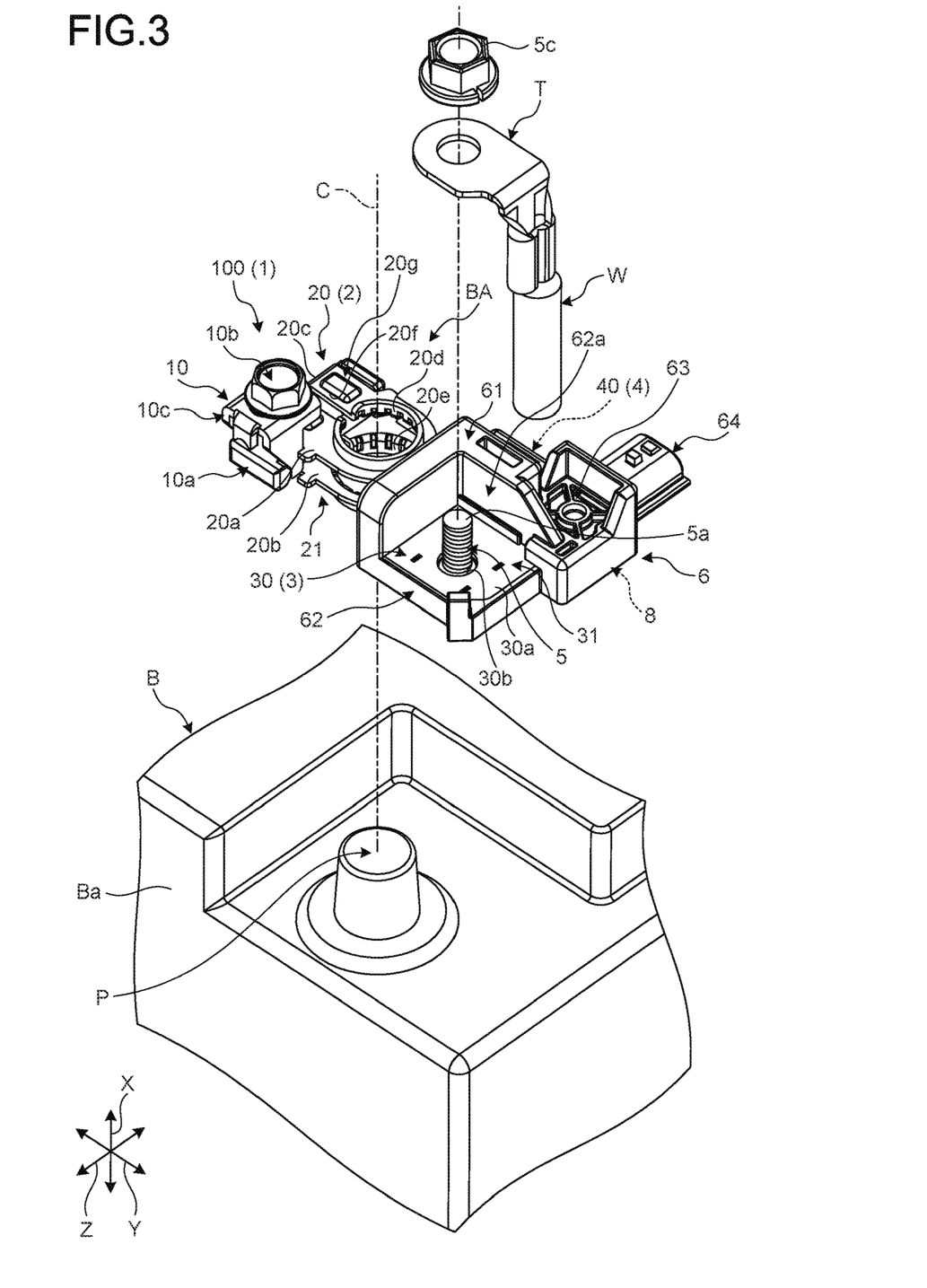
FIG. 3 is an exploded perspective view representing a schematic configuration of the current sensor according to the embodiment.
Figure 4:
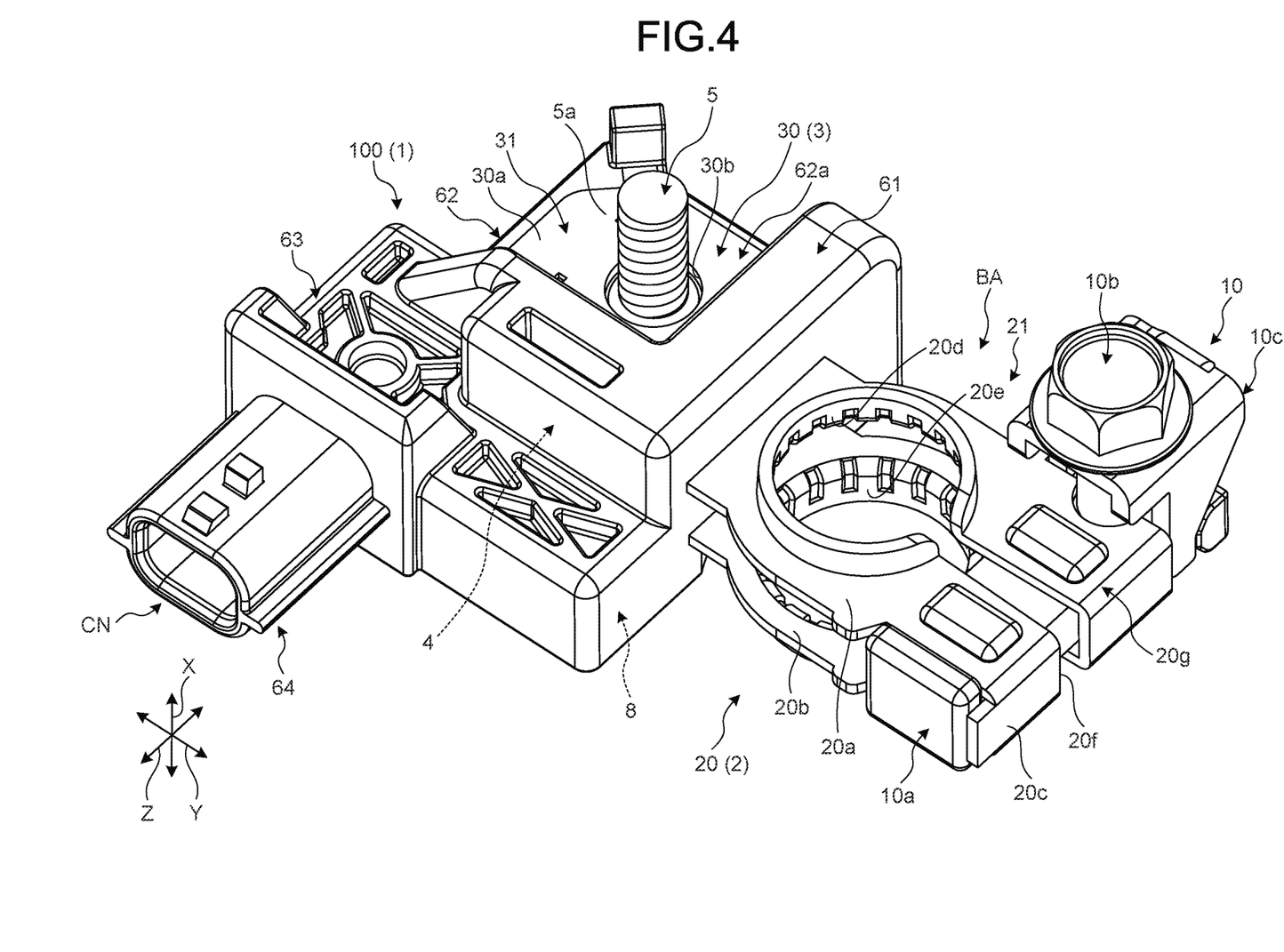
FIG. 4 is a perspective view representing a schematic configuration of the current sensor according to the embodiment.

A current sensor 1 according to the present embodiment illustrated in FIG. 1, FIG. 2, and FIG. 3 is a sensor for measuring a charge/discharge current of a battery B mounted on a vehicle V. In a power supply system S of the vehicle V including the battery B, consumption of the battery B tends to be relatively increased as a type and the number of electric components of the vehicle V are increased in recent years, so that there is the demand that a state of the battery B should be monitored more properly to cope with such a tendency. To respond to the demand, the power supply system S detects a charge/discharge current of the battery B by the current sensor 1, and monitors remaining capacity of the battery B, detects consumption (a degree of deterioration) of the battery B, or performs processing of improving fuel efficiency by controlling operation of a power generator G such as an alternator, for example, based on the detected current (current value).

The current sensor 1 according to the present embodiment includes a battery attachment structure, and constitutes a battery-terminal integrated sensor that is integrated with a battery terminal (battery terminal part 2) herein. The battery B is mounted on the vehicle V as a power storage device herein. In the battery B, a battery post P is erected on a battery housing Ba that houses a battery liquid and various constituent parts. The battery post P is a lead electrode, and erected on one of surfaces of the battery housing Ba, typically, on a surface that is positioned on an upper side in the vertical direction in a state in which the battery B is mounted on the vehicle V. The battery post P projects from the surface on the upper side in the vertical direction of the battery housing Ba toward the upper side in the vertical direction. The battery post P is formed in a cylindrical shape, more specifically, in a cylindrical shape that is tapered to have a smaller diameter as coming closer to a distal end side. The battery post P is disposed so that the center axis C runs along the vertical direction, that is, the axial direction X herein, and extends along the axial direction X in a pillar shape. Two battery posts P in total are disposed in one battery B, one of the battery posts P is a positive electrode (plus (+) electrode), and the other one thereof is a negative electrode (minus (−) electrode) (only one thereof is illustrated in FIG. 2 and FIG. 3, for example).

The current sensor 1 constituting the battery-terminal integrated sensor is fastened to the battery post P that is configured as described above. The current sensor 1 according to the present embodiment is disposed on the battery post P on the negative electrode side of the battery B, intervenes in between the battery B and parts including the power generator G, a vehicle load part L, a grounding part (vehicle body and the like) GND, and the like, and detects an electric current flowing between these parts and the battery post P. Herein, the current sensor 1 is fastened to the battery post P on the negative electrode side, electrically connected to the battery post P, and electrically connected to a connection terminal T disposed at an end of an electric wire (for example, a ground wire) W on the grounding part GND side. The current sensor 1 is interposed between the connection terminal T and the battery post P, electrically connects the connection terminal T with the battery post P, and detects an electric current flowing between the connection terminal T and the battery post P.

The current sensor 1 according to the present embodiment is what is called a shunt-type current sensor. That is, the current sensor 1 causes an electric current to flow through a shunt resistor 40 (refer to FIG. 5, for example), and measures a current value based on a voltage drop at the time of energization and a resistance value of the shunt resistor 40 using Ohm's law. For example, the current sensor 1 outputs a voltage (detected voltage) that is generated at both ends of the shunt resistor 40 in accordance with the electric current flowing in the shunt resistor 40. This output from the shunt resistor 40 may be amplified by an amplifier. The current sensor 1 then detects the electric current flowing in the shunt resistor 40 based on the output from the shunt resistor 40. As compared with a magnetic detection-type current sensor using what is called a Hall IC and the like, for example, the shunt-type current sensor 1 has advantages that a range of selection of electronic components is wide, which flexibly enables improvement in accuracy or price down, and that use of an alloy having a resistance value with less temperature variation as the shunt resistor 40 enables a favorable temperature characteristic, small influence of an external magnetic field, and light weight due to unnecessity of a core, a shield plate, and the like.

The current sensor 1 according to the present embodiment constitutes a current sensor of battery-voltage integrated sensor in which a voltage sensor part 12 that detects a battery voltage of the battery B is incorporated together with a current sensor part 4 that detects an electric current via the shunt resistor 40 as described above in the battery-terminal integrated sensor. The following describes configurations of the current sensor 1 in detail with reference to the drawings.

Specifically, as illustrated in FIG. 1, FIG. 2, FIG. 3, FIG. 4, FIG. 5, and FIG. 6, the current sensor 1 includes the battery terminal part 2, a terminal connection part 3, the current sensor part 4, a stud bolt 5, a housing 6, connection terminals 7, a circuit board 8, a mold material 9, a fastening mechanism 10, and a processing part 11. In the current sensor 1, a voltage sensor part 12 (refer to FIG. 6, for example) is constituted of part of the battery terminal part 2 (a third detection terminal 20*j* described later). In the current sensor 1, portions excluding a fault determination part 11*b* of the processing part 11 constitute a sensor main body 100, which is actually assembled to the battery post P. In other words, it can be said that the current sensor 1 includes the sensor main body 100 assembled to the battery post P, and the fault determination part 11*b* that is disposed outside separately from the sensor main body 100. The following describes parts of the current sensor 1 mainly with reference to FIG. 2, FIG. 3, FIG. 4, FIG. 5, and FIG. 6, and with reference to FIG. 1, FIG. 7, and FIG. 8 as appropriate.

The battery terminal part 2, the terminal connection part 3, and the current sensor part 4 integrally constitute a busbar assembly BA. In other words, it can be said that the current sensor 1 includes the busbar assembly BA. The busbar assembly BA includes a BT busbar 20, a GND busbar 30, and the shunt resistor 40, which integrally constitute the busbar assembly BA. The BT busbar 20 is a first busbar constituting the battery terminal part 2. The GND busbar 30 is a second busbar constituting the terminal connection part 3. The shunt resistor 40 is a resistor for detecting an electric current that is conductively connected across the BT busbar 20 and the GND busbar 30, and constitutes the current sensor part 4.

Each of the BT busbar 20, the GND busbar 30, and the shunt resistor 40 is a plate-shaped metal conductor having electrical conductivity. The BT busbar 20, the GND busbar 30, and the shunt resistor 40 are subjected to various pieces of working, so as to be formed in respective shapes corresponding to the battery terminal part 2, the terminal connection part 3, and the current sensor part 4. The BT busbar 20 and the GND busbar 30 are constituted of metal having favorable electrical conductivity, for example, copper (Cu) or a copper alloy. On the other hand, the shunt resistor 40 is constituted of a different kind of metal that is different from the BT busbar 20 and the GND busbar 30, for example, a copper-manganese-nickel (Cu—Mn—Ni) based alloy, a copper-nickel (Cu—Ni) based alloy, a nickel-chromium (Ni—Cr) based alloy, or the like having a resistance value that does not easily vary depending on a temperature and having a favorable temperature characteristic.

The battery terminal part 2 is a portion that has electrical conductivity and is fastened to the battery post P, and is constituted of the BT busbar 20 described above. The battery terminal part 2 according to the present embodiment is fastened to the battery post P constituting the negative electrode of the battery B as described above. The battery terminal part 2 includes a main body part 21 and an electrode part 22. The battery terminal part 2 is obtained by performing press bending processing and the like on the BT busbar 20 to integrally form the main body part 21 and the electrode part 22, for example.

The main body part 21 is a main portion to be fastened to the battery post P. The main body part 21 includes a pair of plate parts 20a and 20b, and a bent coupling part 20c. Each of the pair of plate parts 20a and 20b is formed in a plate shape and a substantially rectangular ring shape to which various projections and depressions, and notch shapes are added. Each of the plate parts 20a and 20b has a plate thickness direction along the axial direction X, and extends along the first width direction Y and the second width direction Z. The pair of plate parts 20a and 20b are positioned to be opposed to each other along the axial direction X with a gap therebetween along the axial direction X. In the main body part 21, in a state of being fastened to the battery post P, the plate part 20a is positioned on an upper side in the vertical direction (an opposite side of a disposition surface of the battery post P), and the plate part 20b is positioned on a lower side in the vertical direction (a side of the disposition surface of the battery post P). The plate part 20a and the plate part 20b are integrally formed so that end parts on one side (an opposite side of the electrode part 22 side) in the first width direction Y are continuous to each other via the bent coupling part 20c. Due to this, the main body part 21 is formed to be in a bent state in a substantially U-shape as a whole across the bent coupling part 20c, and the plate part 20a and the plate part 20a are opposed to each other in the axial direction X and vertically laminated substantially in parallel to have a plate shape.

The pair of plate parts 20a and 20b are formed in the substantially rectangular ring shape as described above by forming post insertion holes 20d and 20e thereon respectively. The post insertion holes 20d and 20e are holes into which the battery post P is inserted, and pass through the plate parts 20a and 20b along the axial direction X respectively. The post insertion holes 20d and 20e are formed in a substantially circular shape corresponding to an outer diameter shape of the battery post P. The post insertion hole 20d and the post insertion hole 20e are formed to have a positional relation of being opposed to each other along the axial direction X in a state in which the pair of plate parts 20a and 20b are vertically laminated via the bent coupling part 20c. Inner peripheral wall surfaces of the respective post insertion holes 20d and 20e are tapered corresponding to a taper of the battery post P, and each of the inner peripheral wall surfaces is brought into contact with the battery post P in a state in which the battery post P is inserted therein.

In the main body part 21, a slit (gap) 20f is formed across the pair of plate parts 20a and 20b and the bent coupling part 20c. The slit 20f extends along the first width direction Y to be continuous to the post insertion holes 20d and 20e at end parts of the pair of plate parts 20a and 20b on the bent coupling part 20c side, and extends along the axial direction X at the bent coupling part 20c. In other words, the slit 20f is formed to extend from the post insertion holes 20d and 20e to the bent coupling part 20c while dividing part of the plate parts 20a and 20b. In the main body part 21, a fastening end part 20g is constituted of a portion at which the slit 20f is formed at the end parts of the pair of plate parts 20a and 20b on the bent coupling part 20c side. The fastening end part 20g is a portion to be fastened by the fastening mechanism 10 at the time when the battery terminal part 2 is fastened to the battery post P.

The electrode part 22 is a portion that is positioned side by side with the main body part 21 along the first width direction Y, the portion to which the shunt resistor 40 is joined. The electrode part 22 is integrated with one of the pair of plate parts 20a and 20b, which is the plate part 20b herein, so as to be conductively connected (with reference to FIG. 7). The electrode part 22 includes an extended part 20h and a joint piece part 20i. The extended part 20h is formed in a plate shape by being bent back along the axial direction X at an end part 20ba (refer to FIG. 7) in the first width direction Y of the plate part 20b. The extended part 20h has a plate thickness direction along the first width direction Y, and extends along the axial direction X and the second width direction Z. The extended part 20h is formed to be substantially perpendicularly bent toward one side along the axial direction X from the end part 20ba of the plate part 20b. The extended part 20h extends from the end part 20ba of the plate part 20b toward the plate part 20a side along the axial direction X, and is positioned with a gap between the extended part 20h and an end face of an end part 20aa of the plate part 20a. The joint piece part 20i is formed in a plate shape by being bent back along the first width direction Y from an end part on one side of the extended part 20h in the second width direction Z. The joint piece part 20i has a plate thickness direction along the second width direction Z, and extends along the axial direction X and the first width direction Y. The joint piece part 20i is formed to be substantially perpendicularly bent toward an opposite side of the main body part 21 side along the first width direction Y from an end part of the extended part 20h.

Figure 5:
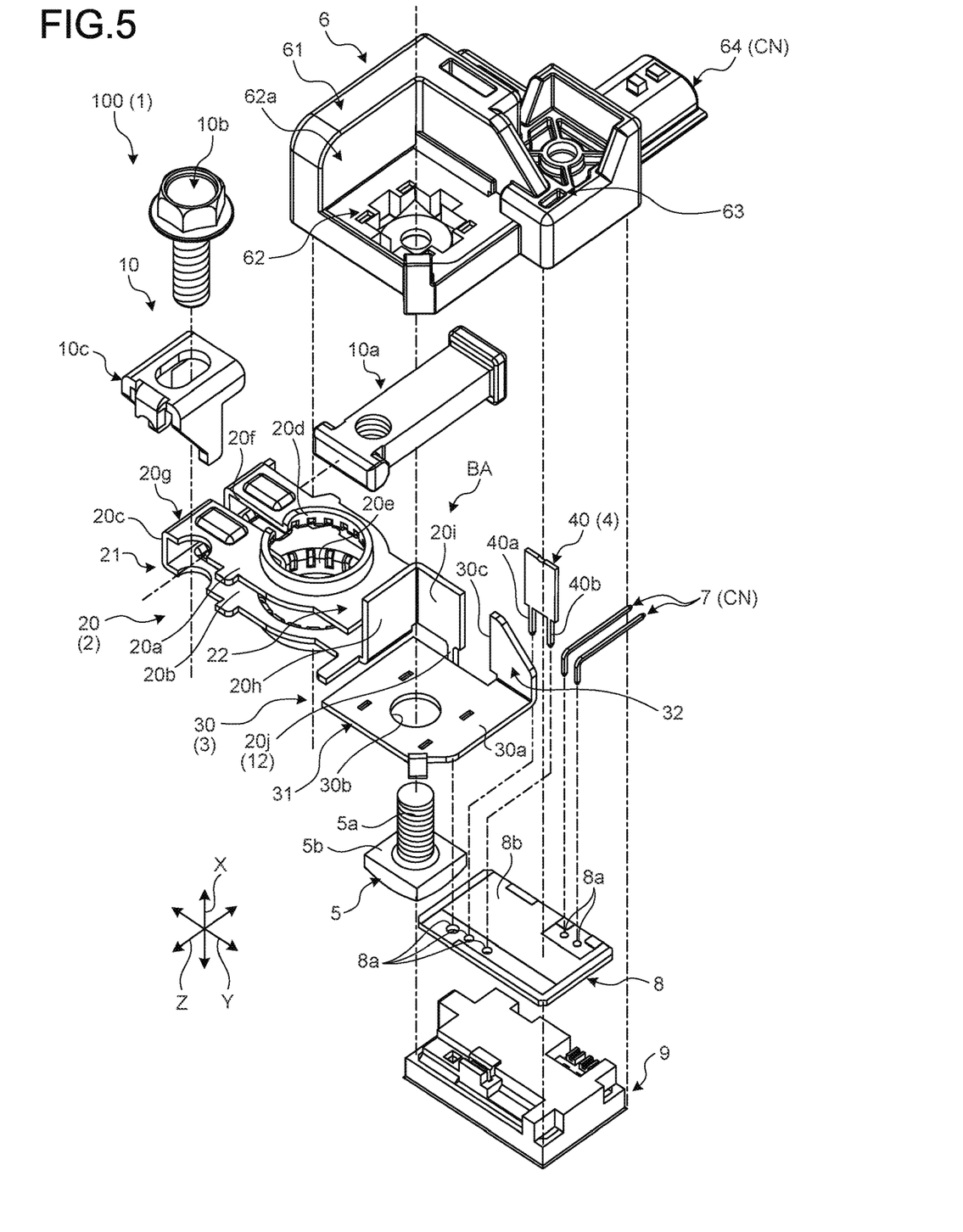
FIG. 5 is an exploded perspective view representing a schematic configuration of the current sensor according to the embodiment.
Figure 6:
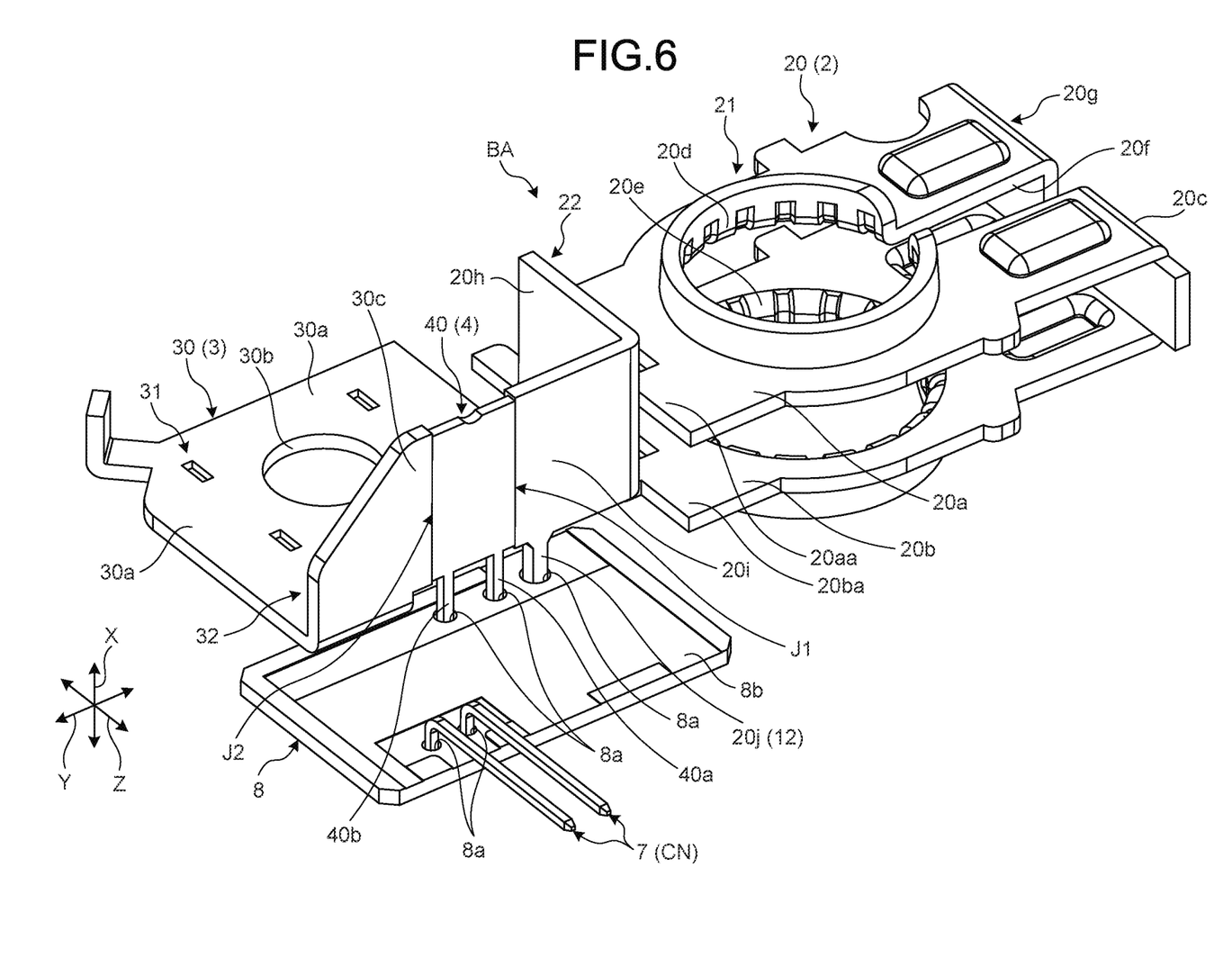
FIG. 6 is an exploded perspective view representing a schematic configuration of a busbar assembly of the current sensor according to the embodiment.

The battery terminal part 2 according to the present embodiment further includes a third detection terminal 20j on the electrode part 22 (particularly refer to FIG. 5 and FIG. 6). Herein, the third detection terminal 20j will be described first, and a first detection terminal 40a and a second detection terminal 40b will be described later together with a configuration of the current sensor part 4.

The third detection terminal 20j is a portion that is disposed on the battery terminal part 2 to constitute the voltage sensor part 12. The voltage sensor part 12 detects a battery voltage as a voltage of the battery B. The third detection terminal 20j is a terminal for detecting a voltage that makes an output for detecting the battery voltage. The third detection terminal 20j is a terminal electrically connected with a processing circuit 11a (described later)

mounted on the circuit board 8. The third detection terminal 20*j* according to the present embodiment is also used as a terminal for detecting a fault that makes an output for detecting a fault such as a connection failure in the processing circuit 11*a*, the first detection terminal 40*a*, the second detection terminal 40*b*, and the third detection terminal 20*j*.

Specifically, the third detection terminal 20*j* is an output terminal that outputs, to the circuit board 8, a voltage (electric potential) that is generated at the joint piece part 20*i* in accordance with an electric current flowing in the joint piece part 20*i* of the electrode part 22 of the battery terminal part 2. The third detection terminal 20*j* is formed to project from an end face on one side in the axial direction X of the joint piece part 20*i* toward the one side along the axial direction X to have a tab shape (pillar shape). More specifically, the third detection terminal 20*j* is formed to project toward the circuit board 8 (described later) side along the axial direction X from an end part opposite to the end part on the extended part 20*h* side of the joint piece part 20*i* (in other words, an end part on the shunt resistor 40 (described later) side).

A distal end side of the third detection terminal 20*j* is electrically connected to the circuit board 8 so as to output, to the circuit board 8, a voltage (electric potential) that is generated at an end part on the shunt resistor 40 side of the joint piece part 20*i* in accordance with the electric current flowing in the joint piece part 20*i*. In the processing circuit 11*a* (described later) mounted on the circuit board 8, the output from the third detection terminal 20*j* is used for detecting the battery voltage of the battery B, or for detecting a fault in the processing circuit 11*a* and the like.

The terminal connection part 3 is a portion having electrical conductivity, to which the connection terminal T of the electric wire W is electrically connected, the portion being constituted of the GND busbar 30 described above. The terminal connection part 3 is positioned side by side with the battery terminal part 2 with a gap therebetween along the first width direction Y, and includes a fastening part 31 and an electrode part 32. In the terminal connection part 3, for example, a fastening part 31 and an electrode part 32 are integrally formed by performing press bending processing and the like on the GND busbar 30.

The fastening part 31 is a portion to which the connection terminal T is fastened and electrically connected. The fastening part 31 includes a plate part 30*a*. The plate part 30*a* is formed in a substantially rectangular plate shape, and electrically connected to the grounding part GND and the like to be grounded via the stud bolt 5, the connection terminal T, the electric wire W, and the like. The plate part 30*a* has a plate thickness direction along the axial direction X, and extends along the first width direction Y and the second width direction Z. A bolt insertion hole 30*b* is formed on the plate part 30*a*. The bolt insertion hole 30*b* is a hole into which a shaft part 5*a* of the stud bolt 5 is inserted, and passes through the plate part 30*a* along the axial direction X.

The stud bolt 5 is a fastening member that fastens and electrically connects the fastening part 31 of the terminal connection part 3 to the connection terminal T. The stud bolt 5 is formed such that the shaft part 5*a* projects from a base part 5*b*. The stud bolt 5 fastens and conductively connects the fastening part 31 of the terminal connection part 3 to the connection terminal T such that a nut 5*c* is screwed to the shaft part 5*a* in a state in which the shaft part 5*a* is inserted into the bolt insertion hole 30*b* and the connection terminal T is assembled thereto.

The electrode part 32 is a portion to which the shunt resistor 40 is joined, the portion being positioned side by side with the electrode part 22 of the battery terminal part 2 with a gap therebetween along the first width direction Y. The electrode part 32 is integrated and conductively connected with the plate part 30*a*. The electrode part 32 includes a joint piece part 30*c*. The joint piece part 30*c* is formed in a plate shape by being bent back along the axial direction X from one end part in the second width direction Z of the plate part 30*a*. The joint piece part 30*c* has a plate thickness direction along the second width direction Z, and extends along the axial direction X and the first width direction Y. The joint piece part 30*c* is formed to be substantially perpendicularly bent toward one side (the same side as the extended part 20*h* of the electrode part 22) along the axial direction X from an end part of the plate part 30*a*.

The current sensor part 4 is a portion that is positioned side by side with the battery terminal part 2 along the first width direction Y, and conductively connected with the battery terminal part 2 to detect an electric current. Herein, the current sensor part 4 is positioned between the battery terminal part 2 and the terminal connection part 3 along the first width direction Y. The current sensor part 4 according to the present embodiment constitutes a shunt-type current sensor part, and includes the shunt resistor 40 described above.

The shunt resistor 40 is formed in a plate shape, and conductively connected to one of the pair of plate parts 20*a* and 20*b* of the battery terminal part 2, the plate part 20*b* herein, via the electrode part 22. The shunt resistor 40 is positioned between the joint piece part 20*i* and the joint piece part 30*c* in a state in which an end face of the joint piece part 20*i* of the electrode part 22 of the battery terminal part 2 and an end face of the joint piece part 30*c* of the electrode part 32 of the terminal connection part 3 are positioned to be opposed to each other along the first width direction Y. The shunt resistor 40 is joined to the joint piece part 20*i* and the joint piece part 30*c*. The shunt resistor 40 is joined to the joint piece part 20*i* via a joint part J1, and conductively connected to the battery terminal part 2 (particularly refer to FIG. 6, for example). The third detection terminal 20*j* described above is positioned between the joint part J1 on the negative electrode side of the shunt resistor 40 and the battery post P constituting the negative electrode of the battery B. On the other hand, the shunt resistor 40 is joined to the joint piece part 30*c* via a joint part J2, and conductively connected to the terminal connection part 3 (particularly refer to FIG. 6, for example). In the current sensor part 4, the joint piece part 20*i* of the battery terminal part 2 constitutes an electrode on one side to which the shunt resistor 40 is joined (an electrode on the negative electrode side of the battery B), and the joint piece part 30*c* of the terminal connection part 3 constitutes an electrode on the other side to which the shunt resistor 40 is joined (an electrode on the grounding part GND side).

The shunt resistor 40 is formed in a substantially rectangular plate shape, has a plate thickness direction along the second width direction Z, and extends along the axial direction X and the first width direction Y. Both end parts in the first width direction Y of the shunt resistor 40 are respectively joined to the joint piece part 20*i* and the joint piece part 30*c* using various joining means such as laser welding, electron beam welding, or brazing to form the joint parts J1 and J2, and conductive connection is achieved. That is, the joint part J1 constitutes a portion that joins and conductively connects the shunt resistor 40 to the battery terminal part 2 on the negative electrode side of the shunt resistor 40. By contrast, the joint part J2 constitutes a portion that joins and conductively connects the shunt resistor 40 to the terminal connection part 3 on the grounding part GND side of the shunt resistor 40. With this configuration, the shunt resistor 40 is conductively connected across the BT busbar 20 constituting the battery terminal part 2 and the GND busbar 30 constituting the terminal connection part 3.

The shunt resistor 40 includes a pair of the first detection terminal 40a and the second detection terminal 40b at an end face in the axial direction X. The first detection terminal 40a and the second detection terminal 40b are terminals for detecting an electric current that makes an output for detecting the electric current flowing in the shunt resistor 40, in other words, the charge/discharge current of the battery B. The first detection terminal 40a and the second detection terminal 40b are terminals that are electrically connected to the processing circuit 11a (described later) mounted on the circuit board 8.

Specifically, the pair of the first detection terminal 40a and the second detection terminal 40b are output terminals that output, to the circuit board 8, a voltage (potential difference) that is generated between an end part on the joint piece part 20i side of the shunt resistor 40 and an end part on the joint piece part 30c in accordance with the electric current flowing in the shunt resistor 40. The pair of the first detection terminal 40a and the second detection terminal 40b are positioned with a gap therebetween along the first width direction Y at an end face on one side in the axial direction X of the shunt resistor 40, and project from the end face along the axial direction X to have a tab shape (pillar shape). More specifically, the first detection terminal 40a is formed to project toward the circuit board 8 side along the axial direction X from an end part on the joint piece part 20i side of a plate portion of the shunt resistor 40. The second detection terminal 40b is formed to project toward the circuit board 8 side along the axial direction X from an end part on the joint piece part 30c side of the plate portion of the shunt resistor 40. That is, the first detection terminal 40a and the second detection terminal 40b are formed to project toward the same side as a projecting side of the third detection terminal 20j described above along the axial direction X. The first detection terminal 40a, the second detection terminal 40b, and the third detection terminal 20j described above are positioned side by side with a gap along the first width direction Y, the second detection terminal 40b is positioned on one side of the first detection terminal 40a, and the third detection terminal 20j is positioned on the other side of the first detection terminal 40a. In other words, the first detection terminal 40a is positioned between the second detection terminal 40b and the third detection terminal 20j with respect to the first width direction Y.

Distal end sides of the pair of the first detection terminal 40a and the second detection terminal 40b are electrically connected to the circuit board 8 to output, to the circuit board 8, a voltage (potential difference) generated at both end parts of the shunt resistor 40. The outputs from the first detection terminal 40a and the second detection terminal 40b are used for detecting the electric current flowing in the shunt resistor 40 by the processing circuit 11a (described later) mounted on the circuit board 8.

The housing 6 is a protecting member that has an insulation property, and incorporates and protects the current sensor part 4 (shunt resistor 40), the connection terminals 7, the circuit board 8, the third detection terminal 20j constituting part of the voltage sensor part 12, and the like. The housing 6 is constituted of a polyphenylene sulfide (PPS) resin and the like having the insulation property and high heat resistance, for example. A resin such as the PPS contains glass fiber to enhance strength of the housing 6. For example, the housing 6 is molded integrally with the busbar assembly BA, the stud bolt 5, the connection terminals 7, and the like by insert molding and the like, and the circuit board 8 is assembled to an inner part of the housing 6 thereafter.

For example, the busbar assembly BA is inserted (set) in a metal mold for insert molding of the housing 6 together with the connection terminals 7 in a state in which the BT busbar 20, the GND busbar 30, and the shunt resistor 40 are integrated with each other and the stud bolt 5 is assembled to the bolt insertion hole 30b. The housing 6 is formed to be integrated with the busbar assembly BA, the stud bolt 5, the connection terminals 7, and the like when an insulating resin is injected into the metal mold to be molded.

The housing 6 incorporates the busbar assembly BA, the stud bolt 5, and the connection terminals 7 therein while exposing part of them to the outside. Specifically, the housing 6 includes a sensor cover part 61, a bolt holding part 62, a substrate cover part 63, and a connector housing part 64, which are integrally formed.

Figure 7:
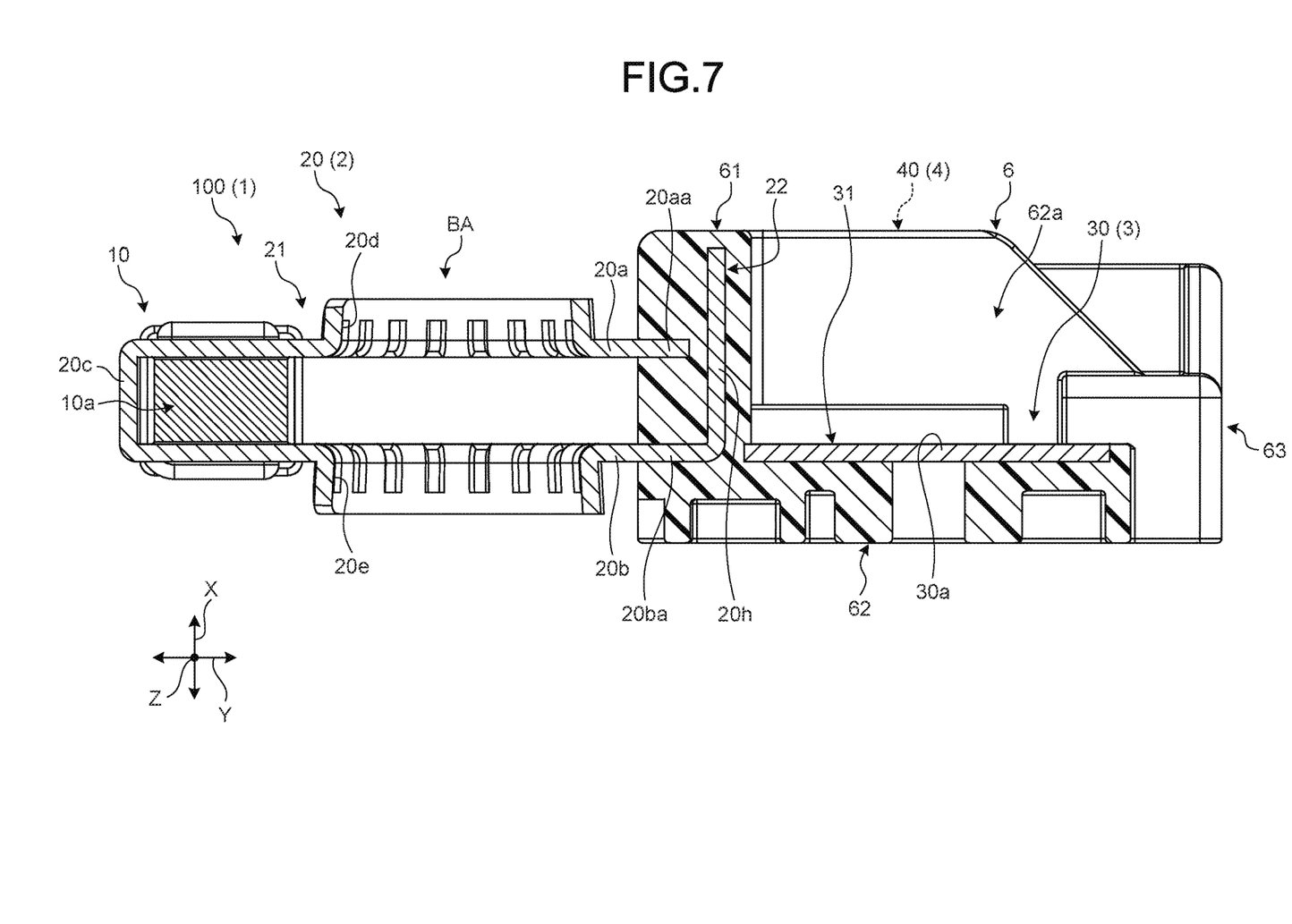
FIG. 7 is a cross-sectional view representing a schematic configuration of the current sensor according to the embodiment.

The sensor cover part 61 is a portion in which the shunt resistor 40 constituting the current sensor part 4 and the third detection terminal 20j constituting the voltage sensor part 12 are embedded, the portion covering and protecting the shunt resistor 40 and the third detection terminal 20j. Herein, the sensor cover part 61 has the entire shunt resistor 40 of the current sensor part 4, together with the entire electrode part 22 of the battery terminal part 2 and the entire electrode part 32 of the terminal connection part 3, embedded therein, and covers and protects them. The sensor cover part 61 is formed in a substantially L-shape viewed along the axial direction X corresponding to a continuous shape of the electrode part 22, the shunt resistor 40, and the electrode part 32. The housing 6 has, as illustrated in FIG. 7, most of the main body part 21 constituting the battery terminal part 2 exposed to the outside thereof, while having the end parts 20aa and 20ba on the electrode part 22 side of the plate parts 20a and 20b constituting the main body part 21 embedded inside the sensor cover part 61, so as to be integrated with each other.

The bolt holding part 62 is a portion in which the stud bolt 5 inserted into the bolt insertion hole 30b of the terminal connection part 3 is embedded, so as to be held. The bolt holding part 62 is disposed at a position adjacent to the sensor cover part 61 along the first width direction Y, the position being on an inner side of the sensor cover part 61 formed in the substantially L-shape. The bolt holding part 62 is formed so as to have a level difference from the sensor cover part 61 along the axial direction X. Herein, the bolt holding part 62 covers and protects the plate part 30a and the base part 5b of the stud bolt 5 embedded therein while exposing one surface of the plate part 30a of the terminal connection part 3 and the shaft part 5a of the stud bolt 5 along one side of the axial direction X. The bolt holding part 62 is formed in a substantially rectangular shape viewed along the axial direction X corresponding to the shapes of the plate part 30a and the base part 5b of the stud bolt 5. The one surface of the plate part 30a and the shaft part 5a of the stud bolt 5 exposed from the bolt holding part 62 are exposed to a space part 62a surrounded by the sensor cover part 61 and the bolt holding part 62. The space part 62a is formed corresponding to the level difference between the sensor cover part 61 and the bolt holding part 62, and the connection terminal T and the nut 5c to be assembled to the shaft part 5a of the stud bolt 5 are positioned therein.

The substrate cover part 63 is a portion that houses the circuit board 8 inside thereof, so as to cover and protect the circuit board 8. The substrate cover part 63 is disposed at a position adjacent to the sensor cover part 61 along the first width direction Y and the second width direction Z, the position being opposite to the bolt holding part 62 across the sensor cover part 61 with respect to the second width direction Z. The substrate cover part 63 is formed to have a level difference from the sensor cover part 61 along the axial direction X similarly to the bolt holding part 62. The substrate cover part 63 is formed in a substantially rectangular shape viewed along the axial direction X corresponding to the shape of the circuit board 8 that is formed in the substantially rectangular plate shape.

Figure 8:
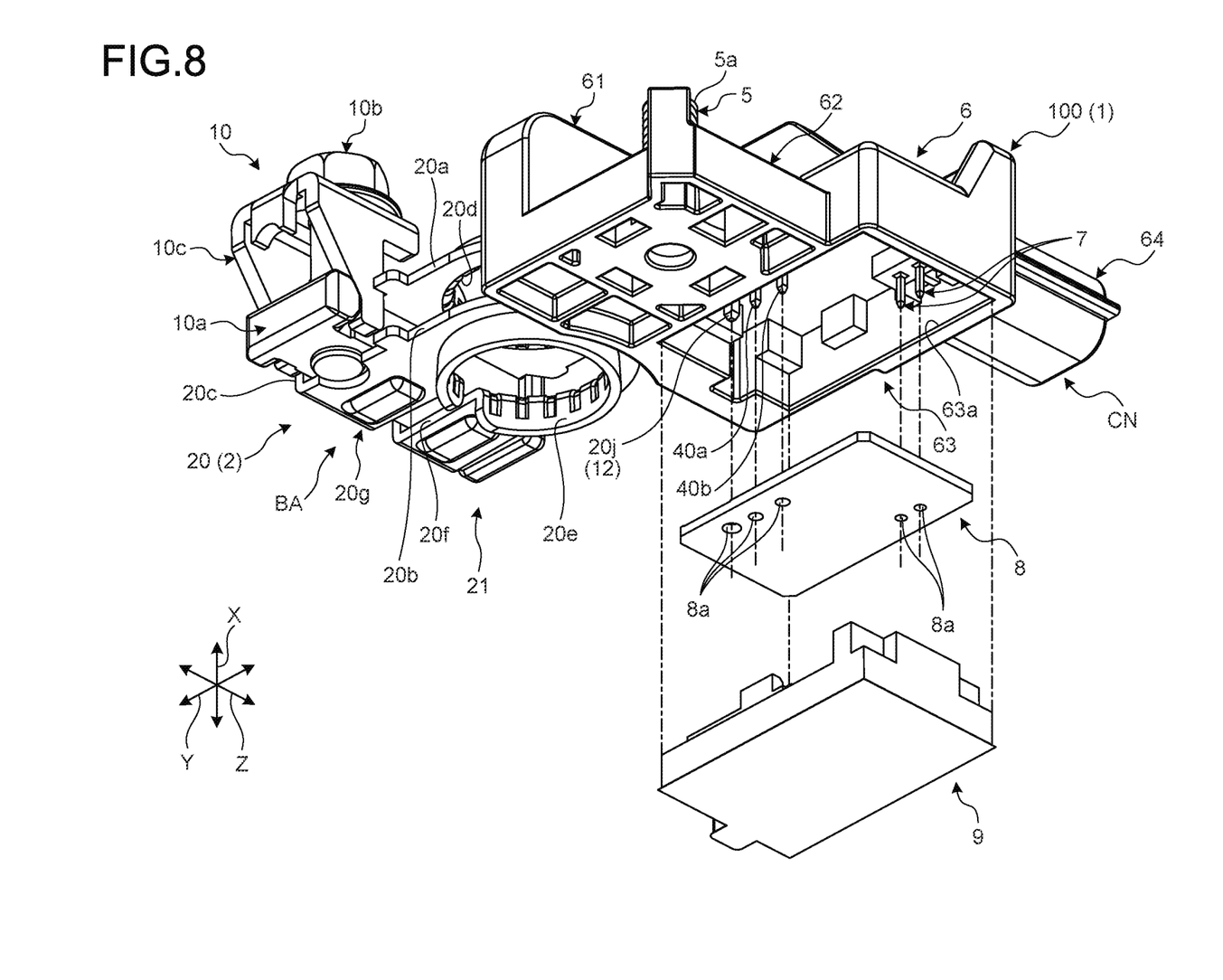
FIG. 8 is an exploded perspective view representing a schematic configuration of the current sensor according to the embodiment.

As illustrated in FIG. 8, a disposition opening part 63*a* is formed on the substrate cover part 63, the disposition opening part 63*a* for assembling the circuit board 8 to an inner part of the substrate cover part 63 after molding the housing 6. The disposition opening part 63*a* is formed as a space part having a substantially rectangular shape corresponding to the shape of the circuit board 8, and opens toward one side of the axial direction X (an opposite side of the side toward which the shaft part 5*a* of the stud bolt 5 projects). End parts of the first detection terminal 40*a* and the second detection terminal 40*b* of the shunt resistor 40, the third detection terminal 20*j* of the battery terminal part 2, and the connection terminals 7 are exposed to the disposition opening part 63*a*. The disposition opening part 63*a* is sealed by the mold material 9 after the circuit board 8 is assembled to the inner part of the substrate cover part 63.

The connector housing part 64 is a portion constituting a connector part CN together with the connection terminals 7. The connector housing part 64 is formed so as to project toward one side (an opposite side of the bolt holding part 62 side) along the second width direction Z from the substrate cover part 63. The connector housing part 64 is formed in a cylindrical shape opening toward one side of the second width direction Z, and holds the connection terminals 7 so that the end parts of the connection terminals 7 are exposed to an inner part of the connector housing part 64.

The connection terminals 7 are terminals that are electrically connected to the circuit board 8, and electrically connect the current sensor 1 with an external device. Herein, the connection terminals 7 are constituted of a pair of bent terminals that have electrical conductivity and are formed in a substantially L-shape. As described above, the connection terminals 7 are embedded in the connector housing part 64 to be integrated therewith by insert molding. In a state in which the connection terminals 7 are embedded in the connector housing part 64, one end part of the connection terminal 7 is exposed to the inside of the connector housing part 64 along the second width direction Z, and the other end part thereof is exposed to the inside of the disposition opening part 63*a* described above along the axial direction X. The connector part CN constituted of the connector housing part 64 and the connection terminals 7 is connector-engaged with a counterpart connector to be electrically connected with the counterpart connector, and electrically connects a connection party on the outside with the circuit board 8. Herein, the connection party of the circuit board 8 via the connection terminals 7 includes, for example, an output destination of a sensor output, a positive electrode side of the battery B, and the like. The output destination of a sensor output includes, for example, the fault determination part 11*b* (described later) and the like constituted of an arithmetic part constituting a high-order ECU in the vehicle V. One of the pair of connection terminals 7 outputs a sensor output detected by the current sensor part 4 or the voltage sensor part 12 to the outside, for example. The other one of the pair of connection terminals 7 inputs an output from the positive electrode side of the battery B (a voltage (electric potential) on the positive electrode side) to the processing circuit 11*a* (described later) mounted on the circuit board 8, for example.

The circuit board 8 includes electronic components mounted thereon to constitute an electronic circuit. The circuit board 8 is conductively connected to the third detection terminal 20*j* of the battery terminal part 2, and the first detection terminal 40*a* and the second detection terminal 40*b* of the shunt resistor 40, and includes electronic components mounted thereon for implementing various functions such as the amplifier and the processing circuit 11*a* (described later) (refer to FIG. 1), for example. The circuit board 8 is, for example, constituted of what is called a printed circuit board (PCB). In the circuit board 8, a wiring pattern (print pattern) is printed on an insulating layer made of insulating material such as an epoxy resin, a glass epoxy resin, a paper epoxy resin, or ceramic using conductive material such as copper, and a circuit body is configured by the wiring pattern. The circuit board 8 is formed in a substantially rectangular plate shape, has a plate thickness direction along the axial direction X, and extends along the first width direction Y and the second width direction Z in a state in which the circuit board 8 is housed in the substrate cover part 63.

The circuit board 8 includes a plurality of through holes 8*a* passing therethrough along the axial direction X. As illustrated in FIG. 8, the circuit board 8 is assembled to the inside of the substrate cover part 63 via the disposition opening part 63*a* described above. In this case, the circuit board 8 is assembled to the inside of the substrate cover part 63 by inserting the first detection terminal 40*a* and the second detection terminal 40*b* of the shunt resistor 40, the third detection terminal 20*j* of the battery terminal part 2, the connection terminals 7, and the like into the through holes 8*a* along the axial direction X. In the circuit board 8, the first detection terminal 40*a*, the second detection terminal 40*b*, the third detection terminal 20*j*, the connection terminals 7, and the like inserted into the through holes 8*a* are soldered to the circuit body, so as to constitute an electronic circuit that electrically connects them. Herein, as illustrated in FIG. 6, for example, in the circuit board 8, a normal line of a principal plane 8*b* on one side of the axial direction X runs along the axial direction X, and the shunt resistor 40 is erected along a normal direction (in this case, the axial direction X) on the principal plane 8*b*. The mold material 9 is filled in the disposition opening part 63*a* after the circuit board 8 is assembled to the inner part of the substrate cover part 63 to seal the disposition opening part 63*a* by the mold material 9.

A voltage (potential difference) generated at both end parts of the shunt resistor 40 is input to the circuit board 8 via the pair of the first detection terminal 40*a* and the second detection terminal 40*b* that are connected as described above. A voltage (electric potential) generated at the joint piece part 20*i*, in other words, a voltage (electric potential) of the negative electrode of the battery B is input to the circuit board 8 via the third detection terminal 20*j* that is connected as described above. The circuit board 8 may amplify the input voltage (detected voltage) by the amplifier, and output the detected voltage that has been amplified to the high-order ECU (the fault determination part 11*b* and the like constituted of the arithmetic part) via the connection terminals 7 (analog output). In this case, the high-order ECU calculates a current value and a battery voltage value based on the detected voltage that has been input. The circuit board 8 may include a microcomputer or the processing circuit 11*a* as electronic components mounted thereon, calculate a current value and a battery voltage value by the microcomputer or the processing circuit 11a based on the detected voltage that has been amplified by the amplifier, and output a detection signal representing the calculated current value or battery voltage value to the high-order ECU (the fault determination part 11b and the like constituted of the arithmetic part) via the connection terminals 7 (digital output). The following describes a case in which the circuit board 8 performs digital output in the current sensor 1 by way of example.

As described above, the mold material 9 is a sealing member that is filled in the disposition opening part 63a of the housing 6, so as to seal the disposition opening part 63a. Typically, the mold material 9 is constituted of resin material softer than resin material constituting the housing 6. The mold material 9 is constituted of a urethane resin and the like having an insulation property and high adhesion, for example.

The fastening mechanism 10 is a mechanism that fastens the battery terminal part 2 to the battery post P by fastening the fastening end part 20g of the battery terminal part 2 along the second width direction Z. By way of example, the fastening mechanism 10 includes a plate nut 10a as a penetrating member, a fastening bolt 10b as a fastening member, and a bracket 10c as a pressing force conversion member, which cooperate with each other to generate force for fastening the fastening end part 20g along the second width direction Z. Herein, the fastening mechanism 10 constitutes a mechanism of upper-fastening type for fastening the battery terminal part 2 to the battery post P by rotating the fastening bolt 10b extending along the axial direction X about the axial direction X. The fastening mechanism 10 is mounted on the fastening end part 20g by inserting the plate nut 10a into the fastening end part 20g, so as to have a positional relation such that the plate nut 10a traverses the slit 20f along the second width direction Z, and assembling the fastening bolt 10b and the bracket 10c to the plate nut 10a.

The processing part 11 processes outputs from respective detection terminals, that is, the first detection terminal 40a, the second detection terminal 40b, and the third detection terminal 20j. As illustrated in FIG. 1, the processing part 11 according to the present embodiment includes the processing circuit 11a mounted on the circuit board 8, and the fault determination part 11b constituted of the arithmetic part (microcomputer) outside the sensor main body 100.

The processing circuit 11a is a circuit that measures a voltage between terminals including the first detection terminal 40a, the second detection terminal 40b, and the third detection terminal 20j, the voltage that varies in response to charge and discharge of the battery B, and detects a charge/discharge current flowing in the shunt resistor 40 and a battery voltage. The processing circuit 11a includes a first current detection circuit 11aa, a second current detection circuit 11ab, and a third current detection circuit 11ac as current detection parts, and a voltage detection circuit 11ad as a voltage detection part.

The first current detection circuit 11aa constitutes a current detection main circuit for measuring a current value of a charge/discharge current flowing between the first detection terminal 40a and the second detection terminal 40b of the shunt resistor 40. The first detection terminal 40a and the second detection terminal 40b are electrically connected to the first current detection circuit 11aa, and an output from the first detection terminal 40a and an output from the second detection terminal 40b are input to the first current detection circuit 11aa. In accordance with the output from the first detection terminal 40a and the output from the second detection terminal 40b, the first current detection circuit 11aa measures a current value of the electric current flowing between the first detection terminal 40a and the second detection terminal 40b from a resistance value and a voltage drop between the terminals based on Ohm's law. The first current detection circuit 11aa then outputs the measured current value to the fault determination part 11b as a sensor output via the connection terminals 7.

The second current detection circuit 11ab constitutes a first sub-circuit for measuring a current value of the charge/discharge current flowing between the third detection terminal 20j of the battery terminal part 2 and the second detection terminal 40b of the shunt resistor 40, which is a current value for detecting a fault. The third detection terminal 20j and the second detection terminal 40b are electrically connected to the second current detection circuit 11ab, and an output from the third detection terminal 20j and an output from the second detection terminal 40b are input to the second current detection circuit 11ab. In accordance with the output from the third detection terminal 20j and the output from the second detection terminal 40b, the second current detection circuit 11ab measures a current value of the electric current flowing between the third detection terminal 20j and the second detection terminal 40b from a resistance value and a voltage drop between the terminals based on Ohm's law. The second current detection circuit 11ab then outputs the measured current value to the fault determination part 11b as a sensor output via the connection terminals 7.

The third current detection circuit 11ac constitutes a second sub-circuit for measuring a current value of the charge/discharge current flowing between the third detection terminal 20j of the battery terminal part 2 and the first detection terminal 40a of the shunt resistor 40, which is a current value for detecting a fault. The third detection terminal 20j and the first detection terminal 40a are electrically connected to the third current detection circuit 11ac, and an output from the third detection terminal 20j and an output from the first detection terminal 40a are input to the third current detection circuit 11ac. In accordance with the output from the third detection terminal 20j and the output from the first detection terminal 40a, the third current detection circuit 11ac measures a current value of the electric current flowing between the third detection terminal 20j and the first detection terminal 40a from a resistance value and a voltage drop between the terminals based on Ohm's law. The third current detection circuit 11ac then outputs the measured current value to the fault determination part 11b as a sensor output via the connection terminals 7.

The voltage detection circuit 11ad constitutes a voltage detection main circuit for measuring a voltage value of a battery voltage of the battery B. The third detection terminal 20j of the battery terminal part 2 and one of the connection terminals 7 are electrically connected to the voltage detection circuit 11ad, and an output from the third detection terminal 20j and an output from the positive electrode side of the battery B via the connection terminal 7 are input to the voltage detection circuit 11ad. In accordance with the output from the third detection terminal 20j and the output from the positive electrode side of the battery B, the voltage detection circuit 11ad measures the voltage value of the battery voltage of the battery B based on a voltage drop between the terminals. The voltage detection circuit 11ad then outputs the measured voltage value to the fault determination part 11b as a sensor output via the connection terminal 7.

The fault determination part 11*b* is constituted of a circuit that performs various kinds of arithmetic processing on the sensor output that is input from the processing circuit 11*a*. The fault determination part 11*b* includes, for example, an electronic circuit mainly constituted of a well-known microcomputer including a central processing unit such as a central processing unit (CPU), a micro processing unit (MPU), an application specific integrated circuit (ASIC), and a field programmable gate array (FPGA), a read only memory (ROM), a random access memory (RAM), and an interface. As described above, the fault determination part 11*b* may be constituted of the arithmetic part such as the high-order ECU in the vehicle V, for example.

The fault determination part 11*b* according to the present embodiment performs arithmetic processing for determining a fault based on the sensor output that is input from the processing circuit 11*a*. That is, the fault determination part 11*b* performs processing for determining a fault based on the current value measured by the first current detection circuit 11*aa*, the current value measured by the second current detection circuit 11*ab*, and the current value measured by the third current detection circuit 11*ac*. Herein, the fault determined by the fault determination part 11*b* is a fault such as a connection failure in the processing circuit 11*a*, the first detection terminal 40*a*, the second detection terminal 40*b*, and the third detection terminal 20*j*, for example.

As described above, the current value measured by the first current detection circuit 11*aa* is a current value that is measured in accordance with the output from the first detection terminal 40*a* and the output from the second detection terminal 40*b*, which is a current value of the charge/discharge current flowing between the first detection terminal 40*a* and the second detection terminal 40*b*. The current value measured by the second current detection circuit 11*ab* is a current value that is measured in accordance with the output from the third detection terminal 20*j* and the output from the second detection terminal 40*b*, which is a current value of the charge/discharge current flowing between the third detection terminal 20*j* and the second detection terminal 40*b*. The current value measured by the third current detection circuit 11*ac* is a current value that is measured in accordance with the output from the third detection terminal 20*j* and the output from the first detection terminal 40*a*, which is a current value of the charge/discharge current flowing between the third detection terminal 20*j* and the first detection terminal 40*a*.

The fault determination part 11*b* according to the present embodiment determines a fault in the processing circuit 11*a* and the like based on the current value measured by the first current detection circuit 11*aa*, and a current value obtained by subtracting the current value measured by the third current detection circuit 11*ac* from the current value measured by the second current detection circuit 11*ab*. More specifically, the fault determination part 11*b* compares the current value measured by the first current detection circuit 11*aa* with the current value obtained by subtracting the current value measured by the third current detection circuit 11*ac* from the current value measured by the second current detection circuit 11*ab*, and in a case of determining that the current values are equivalent to each other, determines that the processing circuit 11*a* is normally working. By contrast, the fault determination part 11*b* compares the current value measured by the first current detection circuit 11*aa* with the current value obtained by subtracting the current value measured by the third current detection circuit 11*ac* from the current value measured by the second current detection circuit 11*ab*, and in a case of determining that the current values are not equivalent to each other, determines that the processing circuit 11*a* has a fault. Herein, in a case of determining that an absolute value of a difference between the current value measured by the first current detection circuit 11*aa* and the current value obtained by subtracting the current value measured by the third current detection circuit 11*ac* from the current value measured by the second current detection circuit 11*ab* is smaller than a determination threshold set in advance, the fault determination part 11*b* determines that the current values are equivalent to each other, and determines that the processing circuit 11*a* is normally working. On the other hand, in a case of determining that the absolute value of the difference described above is equal to or larger than the determination threshold set in advance, the fault determination part 11*b* determines that the current values are not equivalent to each other, and determines that the processing circuit 11*a* and the like have a fault.

The current sensor 1 configured as described above is fastened to the battery post P by fastening the fastening end part 20*g* by the fastening mechanism 10 in a state in which the battery post P is inserted into the post insertion holes 20*d* and 20*e* of the battery terminal part 2. Although not specifically described, in a case of fastening the battery terminal part 2 to the battery post P with the fastening mechanism 10, the fastening bolt 10*b* is fastened along the axial direction X in a state in which the battery post P is inserted into the post insertion holes 20*d* and 20*e*. Due to this, the fastening mechanism 10 generates fastening force along the axial direction X between the fastening bolt 10*b* and the plate nut 10*a*. The fastening mechanism 10 then fastens the fastening end part 20*g* along the second width direction Z to narrow the width of the slit 20*f* via the plate nut 10*a* and the bracket 10*c* by converted pressing force. As a result, the fastening mechanism 10 can reduce diameters of the post insertion holes 20*d* and 20*e*, and fasten the battery terminal part 2 of the sensor main body 100 to the battery post P to be conducted.

In the current sensor 1, the connection terminal T is fastened to the shaft part 5*a* by assembling the connection terminal T to the shaft part 5*a* of the stud bolt 5 and screwing the nut 5*c* thereto, and the connection terminal T and the fastening part 31 of the terminal connection part 3 are conductively connected.

In this state, the current sensor 1 detects an electric current flowing between the connection terminal T and the battery post P by the current sensor part 4, and outputs the detected sensor output to the fault determination part 11*b* via the connector part CN. The current sensor 1 detects the battery voltage of the battery B by the voltage sensor part 12, and outputs the detected sensor output to the fault determination part 11*b* via the connector part CN. Furthermore, in the current sensor 1, the fault determination part 11*b* determines a fault in the processing circuit 11*a* based on the respective current values measured by the first current detection circuit 11*aa*, the second current detection circuit 11*ab*, and the third current detection circuit 11*ac*.

The current sensor 1 described above detects the electric current in accordance with the outputs from the first detection terminal 40*a* and the second detection terminal 40*b* of the shunt resistor 40 that is conductively connected, via the joint part J1, to the battery terminal part 2 fastened to the battery post P. With this configuration, the current sensor 1 can also detect the voltage of the battery B in accordance with the output from the third detection terminal 20*j* that is disposed between the joint part J1 and the battery post P in the battery terminal part 2. That is, in the current sensor 1, the sensor main body 100 assembled to the battery post P can detect both of the electric current and the voltage of the battery B at a time.

Herein, resistance values of the joint parts J1 and J2 of the current sensor 1 tend to include a component that is difficult to be controlled in view of design, when being influenced by welding, for example. The joint parts J1 and J2 include a welding material or the like that is influenced by a temperature more easily than the shunt resistor 40 is due to a temperature characteristic, so that the tendency described above is more obvious. By contrast, the current sensor 1 according to the present embodiment can detect the voltage of the battery B in accordance with the output from the third detection terminal 20j that is positioned closer to the battery post P side than the joint part J1 is. With this configuration, the current sensor 1 can detect the voltage of the battery B accurately and precisely while suppressing an error without being influenced by variation in the resistance value of the joint part J1, voltage variation, or the like because a resistance component of the joint part J1 is not interposed between the battery post P and the third detection terminal 20j.

On the other hand, the current sensor 1 can detect the electric current in accordance with the outputs from the pair of the first detection terminal 40a and the second detection terminal 40b projecting from the shunt resistor 40. With this configuration, also in detecting the electric current, the current sensor 1 can detect the electric current accurately and precisely while suppressing an error without being influenced by variation in the resistance value of the joint parts J1 and J2, voltage variation, and the like because the joint part J1 or the joint part J2 is not interposed between the pair of the first detection terminal 40a and the second detection terminal 40b.

That is, the current sensor 1 can detect both of the electric current and the voltage of the battery B accurately and precisely while suppressing an error because the first detection terminal 40a, the second detection terminal 40b, and the third detection terminal 20j are disposed, so as to have the positional relation as described above with respect to the joint parts J1 and J2.

In the current sensor 1, the third detection terminal 20j is shaped by press working or the like in the battery terminal part 2, and integrated with the battery terminal part 2. With this configuration, the current sensor 1 does not require the third detection terminal 20j for detecting the voltage of the battery B to be separately prepared as a component separated from the battery terminal part 2, so that an effect of suppressing component cost, suppressing work steps, suppressing processing cost, and the like can be exhibited.

As described above, the current sensor 1 can properly detect the voltage of the battery B together with the electric current.

Herein, the current sensor 1 described above can measure the electric current flowing in the shunt resistor 40 by the first current detection circuit 11aa in accordance with the output from the first detection terminal 40a and the output from the second detection terminal 40b. Additionally, the current sensor 1 described above can measure the voltage of the battery B by the voltage detection circuit 11ad in accordance with the output from the third detection terminal 20j and the output from the positive electrode side of the battery B.

Furthermore, the current sensor 1 described above can determine a fault such as a connection failure in the processing circuit 11a, the first detection terminal 40a, the second detection terminal 40b, and the third detection terminal 20j by combining the outputs from three terminals including the first detection terminal 40a, the second detection terminal 40b, and the third detection terminal 20j. In this case, the current sensor 1 determines a fault based on the current value obtained by subtracting the current value that is measured based on the output from the first detection terminal 40a and the output from the third detection terminal 20j from the current value that is measured in accordance with the output from the second detection terminal 40b and the output from the third detection terminal 20j. With this configuration, the current sensor 1 can determine a fault by comparing the subtracted current value with the current value that is measured in accordance with the output from the first detection terminal 40a and the output from the second detection terminal 40b while offsetting influence of variation in the resistance value of the joint part J1, voltage variation, and the like as described above. As a result, the current sensor 1 can precisely determine a fault without being influenced by variation in the resistance value of the joint part J1 and the like by setting the determination threshold used for determining a fault to be a relatively small value.

The current sensor according to the embodiment of the present invention described above is not limited to the embodiment described above, and can be variously modified within the scope of claims.

In the above description, in the battery terminal part 2, the pair of plate parts 20a and 20b and the bent coupling part 20c are assumed to be integrally formed by performing press bending processing and the like on the metal plate having electrical conductivity, but the battery terminal part 2 is not limited thereto. For example, the battery terminal part 2 may have a two-layer divided structure including the pair of plate parts 20a and 20b that are separately formed without including the bent coupling part 20c, and may have a configuration of integrating the pair of plate parts 20a and 20b that are separately configured.

In the above description, the extended part 20h is assumed to extend from the end part 20ba of the plate part 20b toward the plate part 20a side along the axial direction X, and to be positioned with a gap between the extended part 20h and the end face of the end part 20aa of the plate part 20a, but the extended part 20h is not limited thereto. For example, the extended part 20h may be conductively connected to both of the pair of plate parts 20a and 20b within the sensor cover part 61.

In the above description, the fastening mechanism 10 is assumed to constitute the upper-fastening type mechanism, but the fastening mechanism 10 is not limited thereto. For example, the fastening mechanism 10 may be a lateral-fastening type mechanism including a bolt and a nut, and fastening the fastening end part 20g along the second width direction Z by fastening the bolt along the second width direction Z.

In the above description, the processing part 11 is assumed to include the processing circuit 11a and the fault determination part 11b, but the processing part 11 is not limited thereto. The processing part 11 does not necessarily include the processing circuit 11a, and may implement a processing function implemented by the processing circuit 11a with the arithmetic part constituting the fault determination part 11b. That is, a current value or a voltage value may be actually calculated by the processing circuit 11a or a microcomputer mounted on the circuit board 8, or the high-order ECU such as the arithmetic part as the output destination of the sensor output as described above. In this case, the current sensor 1 may be configured such that the circuit board 8 makes analog output. The fault determination part 11*b* is not limited to the arithmetic part such as a microcomputer, and may be implemented by other means such as an analog circuit.

The current sensor according to the present embodiment may be configured by appropriately combining the constituent elements in the embodiment and the modification described above.

The current sensor according to the present embodiment detects an electric current in accordance with the outputs from the first detection terminal and the second detection terminal of the shunt resistor that is conductively connected, via the joint part, to the battery terminal part fastened to the battery post. With this configuration, the current sensor can also detect the voltage of the battery in accordance with the output from the third detection terminal that is disposed between the joint part and the battery post in the battery terminal part. As a result, the current sensor exhibits an effect of properly detecting the voltage of the battery together with the electric current.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A current sensor comprising:
  a battery terminal part, having electrical conductivity, fastened to a battery post constituting a negative electrode of a battery; and
  a shunt resistor conductively connected to the battery terminal part via a joint part, the shunt resistor including a first detection terminal and a second detection terminal for detecting an electric current, wherein
  the battery terminal part includes a third detection terminal for detecting a voltage of the battery between the joint part and the battery post, and
  the current sensor is configured to perform a measurement based on an output of the third detection terminal.

2. The current sensor according to claim 1, further comprising:
  a current detection part configured to measure an electric current flowing in the shunt resistor in accordance with an output from the first detection terminal and an output from the second detection terminal; and
  a voltage detection part configured to measure a voltage of the battery in accordance with the output from the third detection terminal and an output from a positive electrode side of the battery.

3. The current sensor according to claim 2, further comprising:
  a fault determination part configured to determine a fault based on a current value that is measured in accordance with an output from the first detection terminal and an output from the second detection terminal, and a current value obtained by subtracting a current value that is measured in accordance with the output from the first detection terminal and the output from the third detection terminal from a current value that is measured in accordance with the output from the second detection terminal and the output from the third detection terminal.

4. The current sensor according to claim 1, further comprising:
  a fault determination part configured to determine a fault based on a current value that is measured in accordance with an output from the first detection terminal and an output from the second detection terminal, and a current value obtained by subtracting a current value that is measured in accordance with the output from the first detection terminal and the output from the third detection terminal from a current value that is measured in accordance with the output from the second detection terminal and the output from the third detection terminal.

5. A current sensor comprising:
  a battery terminal part, having electrical conductivity, fastened to a battery post constituting a negative electrode of a battery; and
  a shunt resistor conductively connected to the battery terminal part via a joint part, the shunt resistor including a first detection terminal and a second detection terminal for detecting an electric current, wherein
  the battery terminal part includes a third detection terminal for detecting a voltage of the battery between the joint part and the battery post, and
  the current sensor further comprises:
    a current detection part configured to measure an electric current flowing in the shunt resistor in accordance with an output from the first detection terminal and an output from the second detection terminal; and
    a voltage detection part configured to measure a voltage of the battery in accordance with an output from the third detection terminal and an output from a positive electrode side of the battery.

6. A current sensor comprising:
  a battery terminal part, having electrical conductivity, fastened to a battery post constituting a negative electrode of a battery; and
  a shunt resistor conductively connected to the battery terminal part via a joint part, the shunt resistor including a first detection terminal and a second detection terminal for detecting an electric current, wherein
  the battery terminal part includes a third detection terminal for detecting a voltage of the battery between the joint part and the battery post, and
  the current sensor further comprises a fault determination part configured to determine a fault based on a current value that is measured in accordance with an output from the first detection terminal and an output from the second detection terminal, and a current value obtained by subtracting a current value that is measured in accordance with the output from the first detection terminal and an output from the third detection terminal from a current value that is measured in accordance with the output from the second detection terminal and the output from the third detection terminal.

* * * * *